(12) United States Patent
Li et al.

(10) Patent No.: US 7,355,896 B2
(45) Date of Patent: Apr. 8, 2008

(54) SYSTEM FOR IMPROVING ENDURANCE AND DATA RETENTION IN MEMORY DEVICES

(75) Inventors: Wenbo Li, Singapore (SG); Maggie L. F. Tan, Singapore (SG); Siow Lee Chwa, Singapore (SG); Fei Xu, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 156 days.

(21) Appl. No.: 11/306,331

(22) Filed: Dec. 22, 2005

(65) Prior Publication Data

US 2007/0147135 A1 Jun. 28, 2007

(51) Int. Cl.
*G11C 11/03* (2006.01)

(52) U.S. Cl. .......................... 365/185.29; 365/185.21; 365/189.11

(58) Field of Classification Search ........... 365/185.29, 365/185.21, 189.11
See application file for complete search history.

(56) References Cited

U.S. PATENT DOCUMENTS

| | | | | |
|---|---|---|---|---|
| 5,953,285 A | * | 9/1999 | Churchill et al. | 365/233 |
| 6,269,036 B1 | * | 7/2001 | Shubat | 365/201 |
| 6,487,137 B2 | * | 11/2002 | Tsuboi et al. | 365/226 |

* cited by examiner

*Primary Examiner*—Pho M. Luu
(74) *Attorney, Agent, or Firm*—Mikio Ishimaru

(57) ABSTRACT

A memory system includes a memory block having at least one memory cell. The current is sensed after the erase operations of the memory cell. A signal is generated in response to the current dropping below a predetermined level after the erase operations of the memory cell. The stress on the memory cell is reduced to a first reduced level for erase operations occurring subsequent to the current dropping below the predetermined level.

16 Claims, 3 Drawing Sheets

SYSTEM FOR IMPROVING ENDURANCE AND DATA RETENTION IN MEMORY DEVICES

TECHNICAL FIELD

The present invention relates generally to integrated circuit memory, and more particularly to a system for improving endurance and data retention in such memory.

BACKGROUND ART

Various types of electronic memory have been developed for computers and similar systems, and each type had specific advantages. For example, dynamic random access memory (DRAM) has a high storage density such that a great amount of data can be stored in a small area. Static random access memory (SRAM) has lower storage density than DRAM but can quickly store and retrieve data.

Other memories include electrically erasable programmable read only memory (EEPROM) and electrically programmable read only memory (EPROM). EEPROM can be easily erased without extra exterior equipment but with reduced data storage density, lower speed, and higher cost. EPROM, in contrast, is less expensive and has greater density but lacks the erase characteristics of EEPROM.

A newer type of memory called "Flash" EEPROM, or Flash memory, has become extremely popular because it combines the advantages of the high density and low cost of EPROM with the ability to electrically erase of EEPROM. Flash memory can be rewritten and can hold its contents without power. Flash memory is a non-volatile memory, which means it can store data and not lose the data when power is lost. It is used in many portable electronic products, such as cell phone, portable computers, voice recorders, etc. as well as in many larger electronic systems, such as cars, planes, industrial control systems, etc.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of charge in nitride traps surrounded by oxide to form an oxide-nitride-oxide (ONO) stack. This structure is referred to as Silicon-Oxide-Nitride-Oxide-Silicon (SONOS).

Each type of memory has specific applications in which it is optimal. However, each requires a different manufacturing process and specialized processes are required to achieve optimal performance in the optimal applications.

In addition, it would be desirable to optimize the performance of each type of memory on the single semiconductor chip.

However, all these different types of memory and their associated circuitry still have major problems. While the general population believes that electronic devices with the different types of memory work until they become obsolete, this is actually not the case. Most memories can degrade over time and fail over relatively short periods of time. Compared to hardcopy materials that last almost indefinitely, a memory system will degrade over time depending upon the number of program and erase cycles the memory is subjected to over its life.

These problems with degradation and failure have become worse as the electronics industry seeks to make smaller and smaller memory to operate at even less power and even greater speeds.

One source of the problems relates to providing the proper stress to the memory during the erase cycle. Providing a voltage during a program-erase cycle for a period of time stresses the memory cells. This stress can reduce the endurance of the memory cell as program-erase cycles increase over the life of the memory.

Solutions to these problems have been long sought and some solutions are accepted by the industry, such as multi pulse program/erase scheme. But such solutions always require very complex circuit designs.

DISCLOSURE OF THE INVENTION

The present invention provides a memory system including a memory block having at least one memory cell. The current is sensed after erase operations of the memory cell. A signal is generated in response to the current dropping below a predetermined level after erase operations of the memory cell. The stress on the memory cell is reduced to a first reduced level during erase operations occurring subsequent to the current dropping below the predetermined level.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the FIGs.

Figure 1:
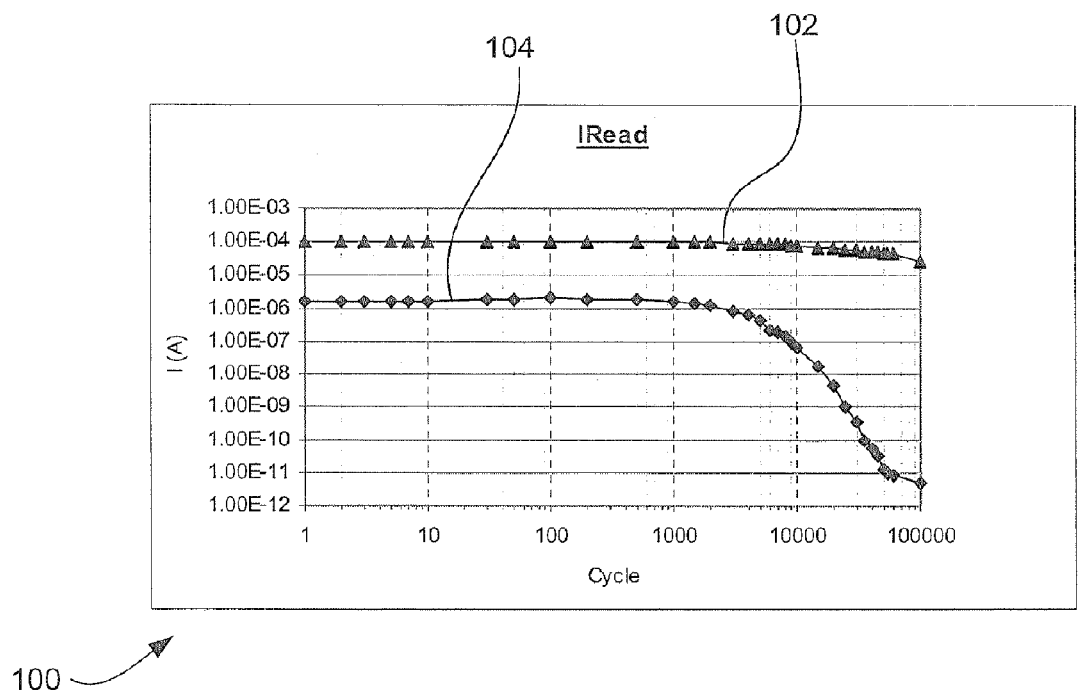
FIG. 1 is a chart showing program current and erase current in typical endurance test results of a memory cell.

Referring now to FIG. 1, therein is shown a chart 100 showing program current and erase current in typical endurance test results of a memory cell (not shown) without using the system of the present invention. The chart 100 is a graph of the read current ($I_{read}$) in a memory as a function of the number of program-erase cycles the memory is subjected to. It can be observed that although $I_{read}$ remains relatively constant over the course of about 10,000 cycles during a program (PGM) status 102, $I_{read}$ degrades substantially over the same number of cycles during an erase (ERS) status 104 revealing a degradation of the memory cell until at approximately 25,000 cycles the memory cell failed. At that point PGM drops are further enhanced.

It is believed that the memory cell degrades because of the stress during the program/erase cycling. As the memory cell degrades, it is harder to be programmed and the original ERS stress places the memory cell in an over erased condition, which can result in the inability to program the memory cell.

Figure 2:
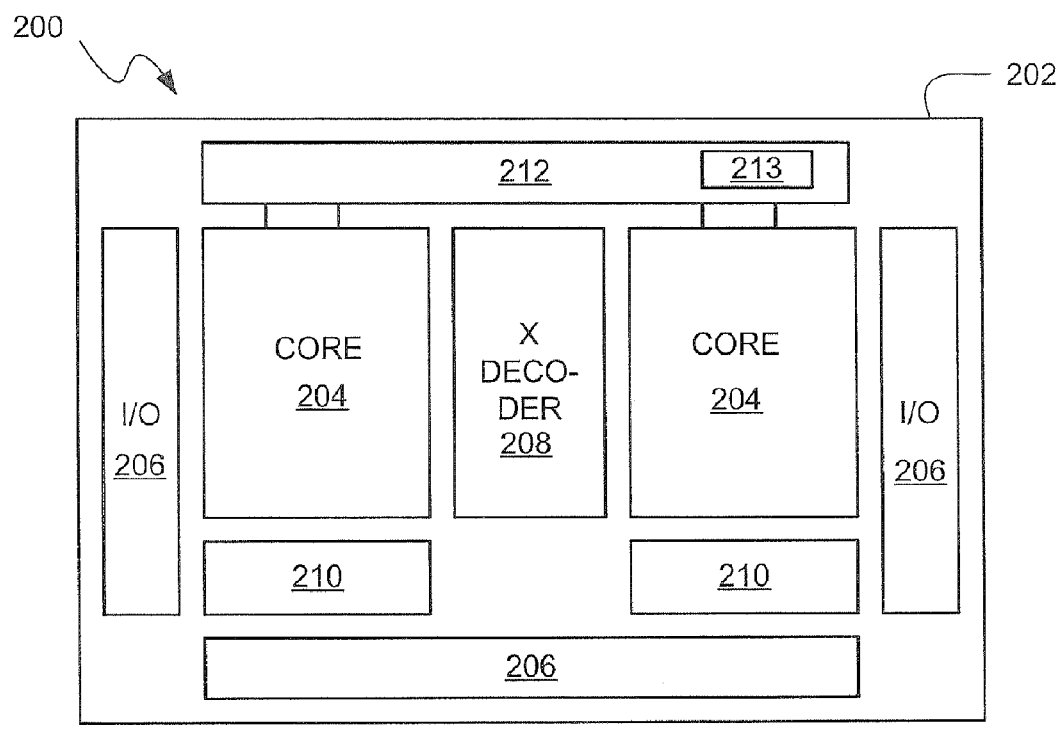
FIG. 2 is a plan view of a memory system in accordance with an embodiment of the present invention.

Referring now to FIG. 2, therein is shown a plan view of a memory system 200 in accordance with an embodiment of the present invention. The memory system 200, such as a SONOS flash memory, commonly includes a semiconductor substrate 202 in which one or more high-density core regions and one or more low-density peripheral portions are formed. High-density core regions typically include one or more M×N array cores 204 of individually addressable, substantially identical memory cells. Low-density peripheral portions typically include input/output (I/O) circuitry 206 and programming circuitry for selectively addressing the individual memory cells. The programming circuitry is represented in part by and includes one or more x-decoders 208 and y-decoders 210, cooperating with I/O circuitry 206 for connecting the source, gate, and drain of selected addressed memory cells to predetermined voltages or impedances to effect designated operations on the memory cell, e.g., programming, reading, and erasing, and deriving necessary voltages to effect such operations.

The memory system 200 also includes a pulse generator and control circuitry 212 described below with reference to FIG. 3. The pulse generator and control circuitry 212 includes a dynamic erase circuit 213.

Figure 3:
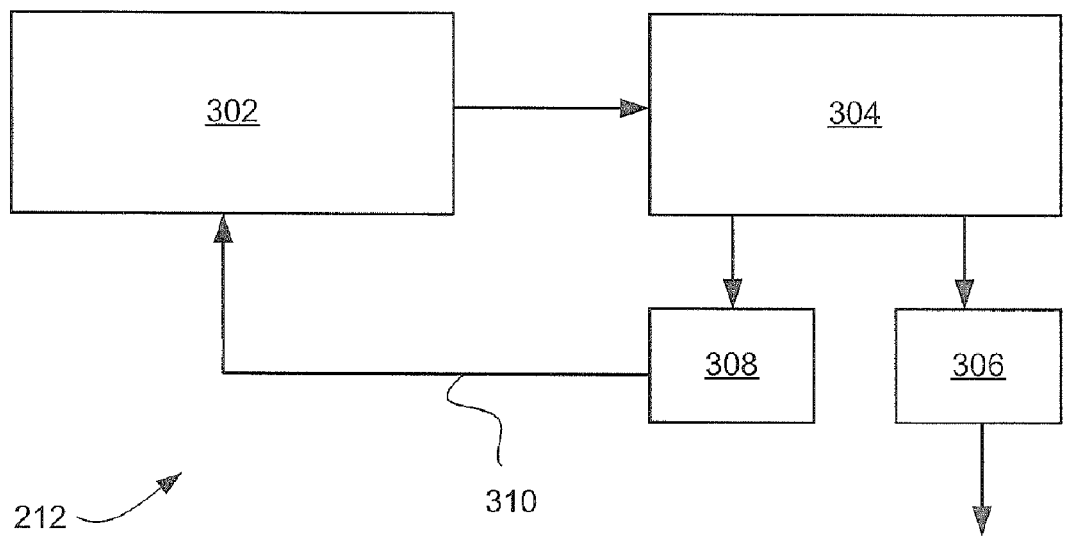
FIG. 3 is a block diagram of a dynamic erase control circuit shown in FIG. 2.

Referring now to FIG. 3, therein is shown block diagram of the pulse generator and control circuitry 212 shown in FIG. 2. The pulse generator and control circuitry 212 includes a pump and pulse control circuit 302. The pump and pulse control circuit 302 is connected to the array cores 204 shown in FIG. 2, which are represented in FIG. 3 by a memory block 304 for controlling the signal during an ERS operation.

A first sense amplifier 306 senses $I_{read}$ in the usual manner and has an output indicative of whether the data in a particular memory cell (not shown) in the array cores 204 is a 0 or a 1. A second sense amplifier 308 is connected to the memory block 304 which also senses $I_{read}$ from the memory block 304, but is connected to provide feedback to the pump and pulse control circuit 302.

In operation, when the second sense amplifier 308 sense a certain level of $I_{read}$ during a ERS operation, an output control clock signal 310 is output and fed back to the pump and pulse control circuit 302. The pump and pulse control circuit 302 receives the output control clock signal 310 and generates a reduced signal in response to the output of the second sense amplifier 308 during subsequent program-erase cycles thereby reducing the stress on individual memory cells in the memory block 304 during such subsequent ERS operations.

After some number of subsequent program-erase cycles, $I_{read}$ may drop to a certain second predetermined level that is lower than the first predetermined level. The second sense amplifier 308 senses the second predetermined level and has an output to the pump and pulse control circuit 302, which generates a second signal to the memory block 304 in response to the output of the second sense amplifier 308 to lower the stress on individual memory cells in the memory block 304 during subsequent ERS operations.

The second sense amplifier 308 can be constructed to sense the level of $I_{read}$ so the pump and pulse control circuit 302 generates multiple signals in response to the output of the second sense amplifier 308 as $I_{read}$ drops to a predetermined level to lower the stress on individual memory cells in the memory block 304 during subsequent erase operations.

Figure 4:
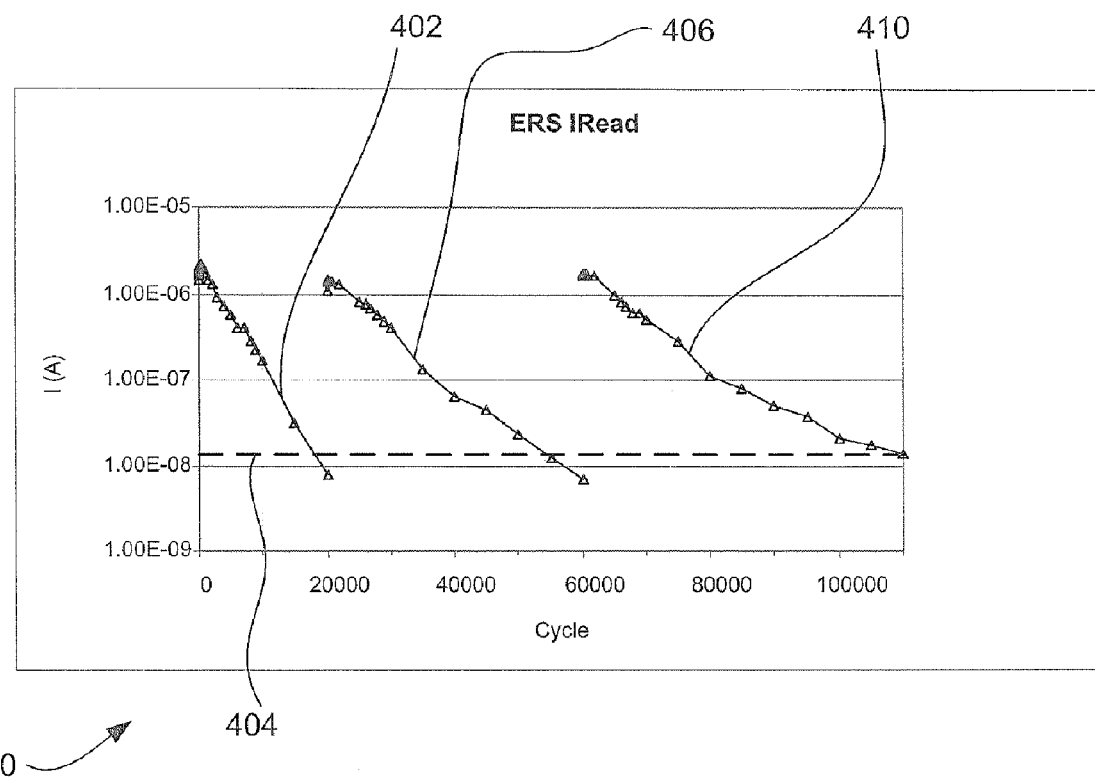
FIG. 4 is a chart showing erase read current measured after erase operations versus the number of program-erase cycles using the memory system of the present invention.

Referring now to FIG. 4, therein is shown a chart 400 showing $I_{read}$ erase read current measured after erase operations versus the number of program-erase cycles using the memory system 200 of the present invention. As the initial $I_{read}$ 402 lowers to a predetermined level 404 that occurs in the example shown at about 20,000 cycles, the second sense amplifier 308 shown in FIG. 3 has an output to the pump and pulse control circuit 302, which lowers the stress on the memory cells in the memory block 304 shown in FIG. 3 during subsequent ERS operations. The second sense amplifier 308 then senses a second $I_{read}$ 406 during subsequent ERS operations while maintaining the stress on the memory cells during the PGM operations.

When the second sense amplifier 308 senses a drop of the second $I_{read}$ 406 to the predetermined level 404 that occurs in the example shown at about 60,000 cycles, the output of the second sense amplifier 308 has an output signal 310 to the pump and pulse control circuit 302, which in turn has an output to the memory block 304 during subsequent erase operations resulting in a third $I_{read}$ 410 during subsequent program-erase operations. The erase stress on memory cells is thus maintained at an acceptable level during a larger number of PGM/ERS cycles.

Figure 5:
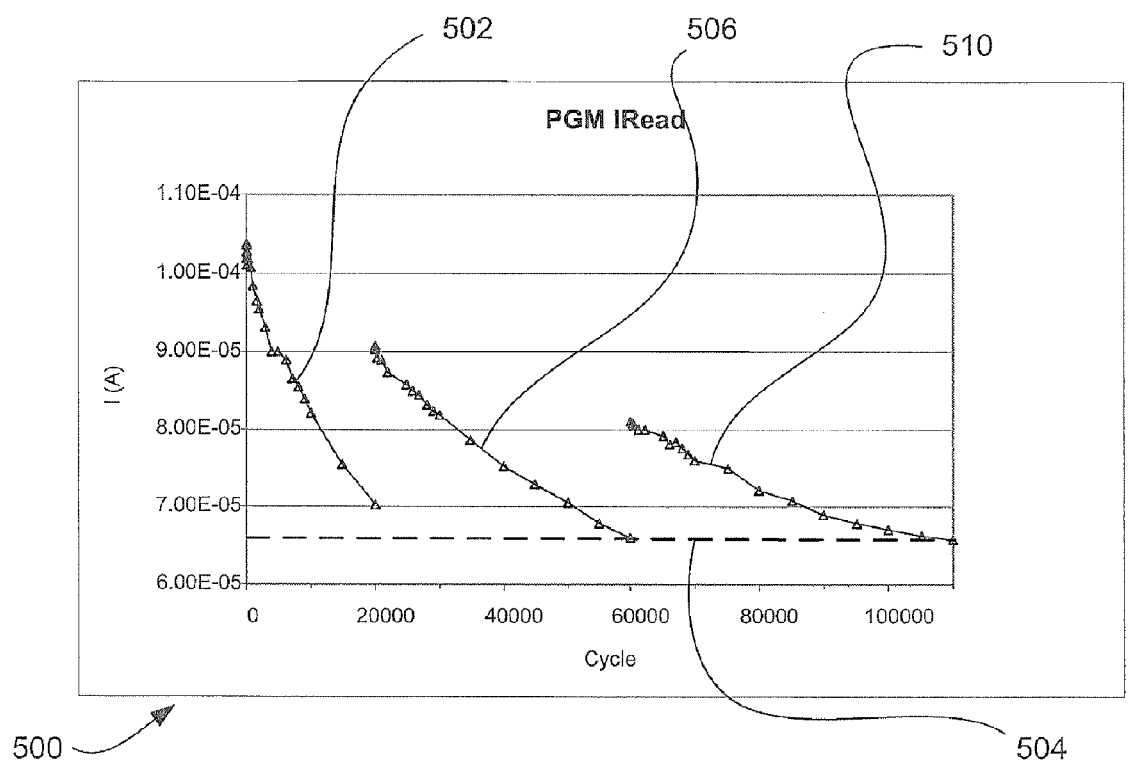
FIG. 5 is a chart showing corresponding program read current to erase read current in FIG. 4 versus the number of program-erase cycles using the memory system of the present invention.

Referring now to FIG. 5, therein is shown a chart 500 showing corresponding PGM $I_{read}$ to ERS $I_{read}$ in FIG. 4 versus the number of program-erase cycles using the memory system 200 of the present invention. An $I_{read}$ 502 drops during the program-erase cycles. ERS stress is reduced at about 20,000 cycles when the second sense amplifier 308 shown in FIG. 3 senses the drop and has an output signal 310 to the pump and pulse control circuit 302. $I_{read}$ generally follows a first current curve 502. It is expected the cell will fail as the $I_{read}$ exemplified by the first curve 502 falls below the PGM control 504 at about 30,000 cycles. With reduced ERS stress, the $I_{read}$ during PGM trend will follow the second current curve 506 until the ERS stress is changed again at about 60,000 cycles. After that, the $I_{read}$ during PGM trend will follow the third current curve 510.

It has been discovered that the system of the present invention results in less stress being required to erase memory cells after cycling. The endurance performance of the memory cells is improved to the point where memory cells can meet or surpass 100,000 program-erase cycles while improving the retention performance of the memory cells.

Figure 6:
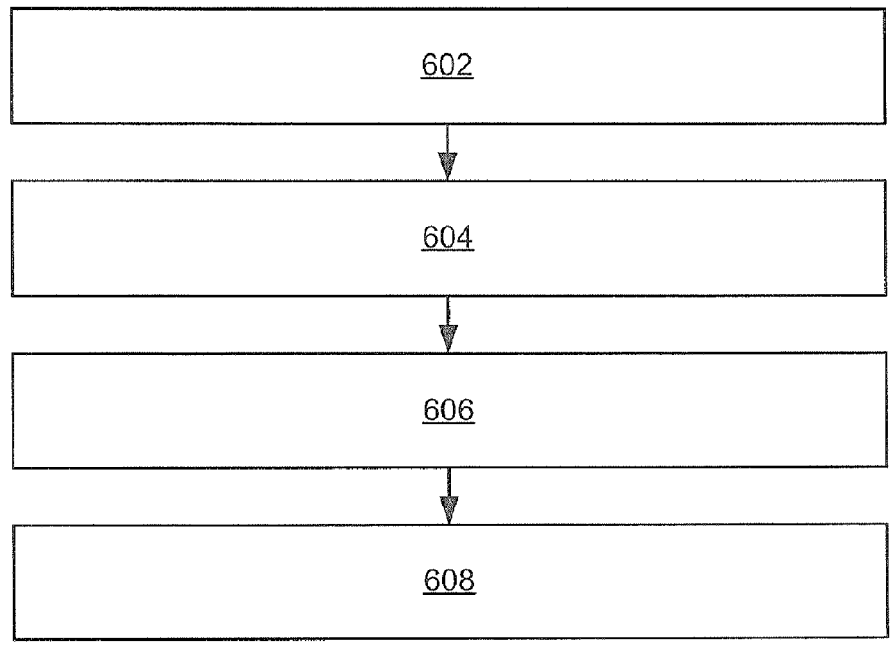
FIG. 6 is a flow chart of a memory system in accordance with an embodiment of the present invention.

Referring now to FIG. 6, therein is shown a flow chart of a memory system 600 in accordance with an embodiment of the present invention. The memory system 600 includes providing a memory block having at least one memory cell in a block 602; sensing the current after the erase operations of the memory cell in a block 604; generating a signal in response to the current dropping below a predetermined level after erase operations of the memory cell in a block 606; and reducing the stress on the memory cell to a first reduced level during erase operations occurring subsequent to the current dropping below the predetermined level in a block 608.

To make more economical and robust memories, besides excellent memory cells, excellent peripheral circuits are also required. The simpler the peripheral circuits, the better, and it would be ideal to have only one erase pulse. During the extensive investigation, it was discovered that data shows the optimized erase stress condition becomes too much for a cell after a number of cycles of program and erase.

The extensive analysis indicated that it is desirable to reduce the erase stress with increments of the program/erase cycles. The data graphs showed that after ten thousand cycles, the current at the erase state becomes very low.

Compared with conventional solution, such as multi pulse program/erase scheme, this invention provides a much simpler solution. For multi pulse scheme, after the first program/erase pulse, a sense amplifier will detect the status of the cell to decide whether the operation is fully finished or not. If it is, the program/erase operation for this cell will be stopped and move to next operation (for example, to program/erase other cells, or read data). If it is not fully finished, for example, if the read current after program is not high enough, then another pulse will be applied to the same cell again to top-up the program. This cycle will continue until the sense amplifier detects a fully programmed/erased status.

Thus, the above scheme can avoid over erase problems. But this scheme requires a very complex circuit design. The control circuit will have to be larger and will require highly accurate signal phase and noise performance. Thus, the integrated circuit design will need to be more robust and the process control needs to be better. All of this will cause yield loss and higher cost.

In this invention, by the addition of another sense amplifier, in addition to a sense amplifier for reading "0" or "1", to sense current in the erase state dropping to a predetermined level, it was discovered that the erase stress could be reduced. A signal is output to the pulse generation circuit so the next time the erase stress is applied, less stress is applied to prolong the life of the memory.

Thus, it has been discovered that the system of the present invention furnish important and heretofore unavailable solutions, capabilities, and functional advantages for memory devices. The resulting process and configurations are straightforward, economical, uncomplicated, highly versatile and effective, use conventional technologies, and are thus readily suited for manufacturing memory devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A memory system comprising:
providing a memory block having at least one memory cell;
sensing the current after the erase operations of the memory cell and after reducing the stress on the memory cell to the first reduced level;
generating a first signal in response to the current dropping below a predetermined level after erase operations of the memory cell;
generating a second signal in response to the current dropping below the predetermined level after erase operations of the memory cell subsequent to reducing the stress to the first reduced level;
reducing the stress on the memory cell to a first reduced level during erase operations occurring subsequent to the current dropping below the predetermined level; and
further reducing the stress on the memory cell to a second reduced level during erase operations occurring subsequent to the current dropping below the predetermined level after erase operations of the memory cell subsequent to reducing the stress to the second reduced level.

2. The memory system as claimed in claim 1, wherein:
sensing the current after erase operations of the memory cell uses a sense amplifier.

3. The memory system as claimed in claim 1, wherein:
generating a signal in response to the current dropping below a predetermined level after the erase operations of the memory cell uses a pump and pulse control circuit.

4. The memory system as claimed in claim 1, further comprising:
maintaining the current during program operations on the memory cell above a predetermined level.

5. A memory system comprising:
providing a memory block having an array of memory cells that are stressed during erase operations;
programming the memory cells in the array using a current having a predetermined level;
sensing the current after the erase operations of the memory cells and after reducing the stress on the memory cell to the first reduced level;
generating a signal in response to the current dropping below a predetermined level after the erase operations of at least one of the memory cells;
generating a second signal in response to the current dropping below the predetermined level after erase operations of the memory cell subsequent to reducing the stress to the first reduced level;
reducing the stress on the at least one of the memory cells to a first reduced level for erase operations occurring subsequent to the current dropping below the predetermined level; and
further reducing the stress on the memory cell to a second reduced level during erase operations occurring subsequent to the current dropping below the predetermined level after erase operations of the memory cell subsequent to reducing the stress to the second reduced level.

6. The memory system as claimed in claim 5, wherein:
sensing the current after erase operations of the memory cell uses a sense amplifier.

7. The memory system as claimed in claim 5, wherein:
generating a signal in response to the current dropping below a predetermined level after the erase operations of the memory cell uses a pump and pulse control circuit.

8. The memory system as claimed in claim 5, further comprising:
maintaining the current during program operations on the at least one memory cell is maintained above a predetermined level.

9. A memory system comprising:
a memory block having at least one memory cell;

circuitry for sensing the current after the erase operations of the memory cell and after reducing the stress on the memory cell to the first reduced level;

circuitry for generating a signal in response to the current dropping below a predetermined level after the erase operations of the memory cell;

circuitry for generating a second signal in response to the current dropping below the predetermined level after erase operations of the memory cell subsequent to reducing the stress to the first reduced level;

circuitry for reducing the stress on the memory cell to a reduced level for erase operations occurring subsequent to the current dropping below the predetermined level; and circuitry for further reducing the stress on the memory cell to a second reduced level during erase operations occurring subsequent to the current dropping below the predetermined level after erase operations of the memory cell subsequent to reducing the stress to the second reduced level.

10. The memory system as claimed in claim 9, wherein:
the circuitry for sensing the current after the erase operations of the memory cell uses a sense amplifier.

11. The memory system as claimed in claim 9, wherein:
the circuitry for generating a signal in response to the current dropping below a predetermined level after the erase operations of the memory cell uses a pump and pulse control circuit.

12. The memory system as claimed in claim 9, further comprising:
circuitry for maintaining the current during program operations on the memory cell is maintained above a predetermined level.

13. A memory system comprising:
a memory block having an array of memory cells that are stressed during erase operations;
circuitry for programming the memory cells in the array using a current having a predetermined level;
circuitry for sensing the current after the erase operations of the memory and after reducing the stress on the memory cell to the first reduced level;
circuitry for generating a signal in response to the current dropping below the predetermined level after the erase operations of at least one of the memory cells;
circuitry for generating a second signal in response to the current dropping below the predetermined level after erase operations of the memory cell subsequent to reducing the stress to the first reduced level;
circuitry for reducing the stress on the at least one of the memory cells to a reduced level for erase operations occurring subsequent to the current dropping below the predetermined level; and
circuitry for further reducing the stress on the memory cell to a second reduced level during erase operations occurring subsequent to the current dropping below the predetermined level after erase operations of the memory cell subsequent to reducing the stress to the second reduced level.

14. The memory system as claimed in claim 13, wherein:
the circuitry for sensing the current after erase operations of the memory cell uses a sense amplifier.

15. The memory system as claimed in claim 13, wherein:
the circuitry for generating a signal in response to the current dropping below a predetermined level after the erase operations of the memory cell uses a pump and pulse control circuit.

16. The memory system as claimed in claim 13, further comprising:
circuitry for maintaining the current during program operations on the at least one memory cell is maintained above a predetermined level.

* * * * *